US009547571B2

(12) United States Patent
Yang et al.

(10) Patent No.: US 9,547,571 B2
(45) Date of Patent: Jan. 17, 2017

(54) BLOCK BEHAVIOR TRACKING IN A MEMORY SYSTEM

(71) Applicant: SanDisk Technologies Inc., Plano, TX (US)

(72) Inventors: Niles Yang, Mountain View, CA (US); Rohit Sehgal, San Jose, CA (US); Abhi Kashyap, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/717,608

(22) Filed: May 20, 2015

(65) Prior Publication Data

US 2016/0342494 A1  Nov. 24, 2016

(51) Int. Cl.
| G06F 11/10 | (2006.01) |
| G06F 11/263 | (2006.01) |
| G06F 3/06 | (2006.01) |
| G11C 16/34 | (2006.01) |
| G11C 29/50 | (2006.01) |
| G11C 7/14 | (2006.01) |
| G11C 8/14 | (2006.01) |
| G11C 11/4099 | (2006.01) |

(52) U.S. Cl.
CPC .......... *G06F 11/263* (2013.01); *G06F 3/0619* (2013.01); *G06F 3/0655* (2013.01); *G06F 3/0688* (2013.01); *G06F 11/1072* (2013.01); *G11C 7/14* (2013.01); *G11C 11/4099* (2013.01); *G11C 29/50004* (2013.01); *G11C 8/14* (2013.01); *G11C 16/3404* (2013.01); *G11C 16/3427* (2013.01); *G11C 2029/5004* (2013.01)

(58) Field of Classification Search
CPC .... G06F 11/263; G06F 3/0655; G06F 11/072; G06F 3/0619; G06F 3/0688; G11C 29/50004; G11C 2029/5004; G11C 16/3427; G11C 16/3404; G11C 7/14; G11C 11/4099; G11C 8/14
USPC ..................................... 713/763; 365/185.03
See application file for complete search history.

(56) References Cited

U.S. PATENT DOCUMENTS

| 7,260,011 | B2 * | 8/2007 | Riho | G06F 11/1004 365/189.07 |
| 8,432,737 | B2 * | 4/2013 | Shiga | G11C 29/025 365/185.09 |
| 8,625,355 | B2 * | 1/2014 | Chokan | G11C 16/0483 365/185.22 |
| 8,949,690 | B2 * | 2/2015 | Sugahara | G06F 11/1048 714/764 |
| 8,958,258 | B2 * | 2/2015 | Okuma | G11C 8/14 365/201 |
| 2013/0188426 | A1 * | 7/2013 | Park | G11C 16/10 365/185.22 |

(Continued)

*Primary Examiner* — James C Kerveros
(74) *Attorney, Agent, or Firm* — Brinks Gilson & Lione

(57) ABSTRACT

A storage device with a memory may include memory block health monitoring and behavior tracking. Each memory block may be analyzed based on one or more dummy wordlines within the block may not be accessible for normal data storage. The dummy wordlines may be programmed with a known data pattern that can be tracked and analyzed for potential errors, which may be used as representation of the health of the memory block. Adjustments can be made to the operating parameters (e.g. read voltages) to optimize each memory block based on its error analysis.

24 Claims, 15 Drawing Sheets

(56) References Cited

U.S. PATENT DOCUMENTS

2015/0117100 A1\* 4/2015 Park ............... G11C 16/10
　　　　　　　　　　　　　　　　365/185.03
2016/0104533 A1\* 4/2016 Tanzawa ......... G11C 16/0483
　　　　　　　　　　　　　　　　365/185.11

\* cited by examiner

State change due to charging behavior
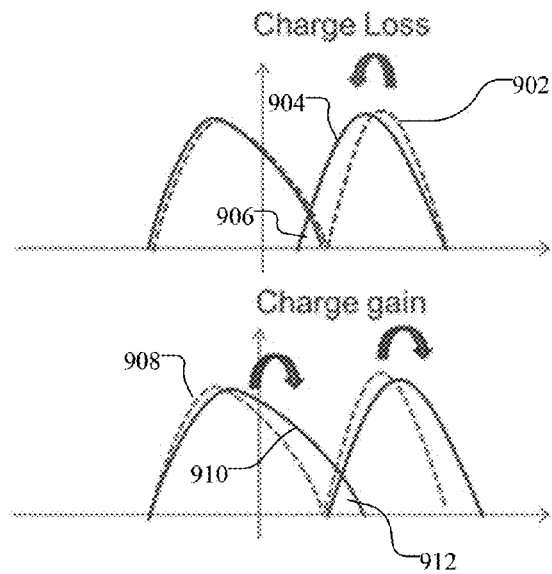
Figure 9
Bias adjustment need for the state change
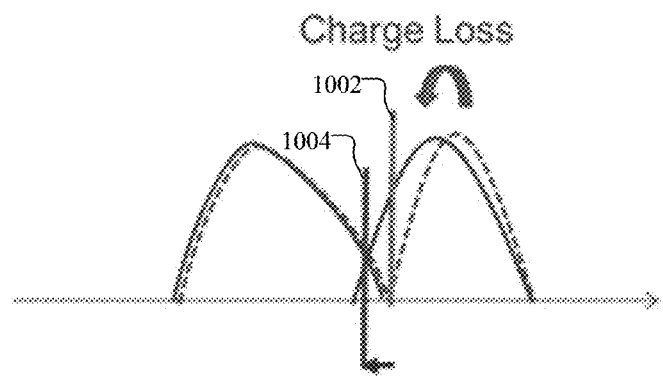
Figure 10
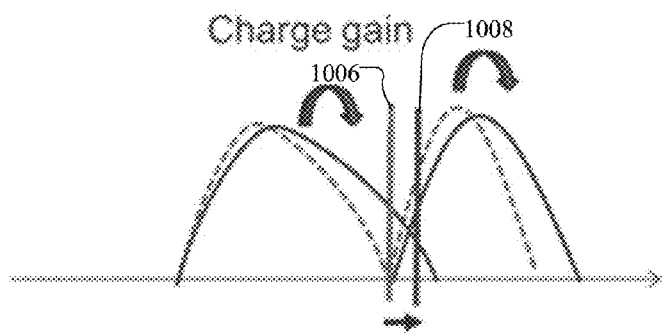

BLOCK BEHAVIOR TRACKING IN A MEMORY SYSTEM

TECHNICAL FIELD

This application relates generally to memory devices. More specifically, this application relates to monitoring memory behavior and health using dummy wordlines as representative of a group of memory such as a block.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. As the non-volatile memory cell scales to smaller dimensions with higher capacity per unit area, the cell endurance due to program and erase cycling, and disturbances (e.g. due to either read or program) may become more prominent. The defect level during the silicon process may become elevated as the cell dimension shrinks and process complexity increases. Further, the memory may have a limited endurance, which determines a number of times a particular memory can be erased and re-programmed. Bit error rate (BER) may be used as an estimate for wear, data retention (DR), read disturb errors, or remaining margin; however, BER is merely the result of the problem and may not be an accurate indicator and predictor of memory block health.

BRIEF DESCRIPTION OF THE DRAWINGS

FIG. 9 is a diagram of state changes in charge levels.

FIG. 10 is a diagram of bias adjustments that can be made in the charge levels of FIG. 9.

DESCRIPTION OF THE EMBODIMENTS

A storage device with a memory may include memory block health monitoring and behavior tracking. Each memory block may be analyzed based on one or more dummy wordlines from the memory block. The dummy wordlines may be programmed with a known data pattern that can be analyzed for potential errors. This error analysis of the dummy wordline may be used for determining a state or health of the memory block. Adjustments can be made to the operating parameters (e.g. read voltages) to optimize each memory block based on its error analysis (i.e. health or behavior tracking). The dummy wordline(s) for each block may be representative of the block as a whole. The behavior tracking, memory health, or overall assessment may include analysis of data retention (DR) errors, read disturb (RD) errors, memory wear, or other impacts from cycling/programming. Based on this assessment/health, modifications can be made to certain memory blocks including limiting usage of certain blocks and modifying the trim levels or voltage distribution levels of blocks. Further, resource allocation (e.g. CPU, RAM, time/computation complexity, etc.) may be modified based on the assessment/health for each block.

In order to increase the flash memory system's endurance and performance, it is desirable to have the memory capable of adjusting its own optimum operating parameters for read, program, and erase to better meet the system requirements. The system may have the capability of setting up the NAND parameters accordingly. A block may have its own characteristics, so the operating conditions should be block or block-group based so that the optimum operating condition for the block or the block-group is individually optimized. One way to track the block or block-group behavior is to use a particular representative wordline of the block which is convenient to access and can represent the DR, RD, or program/erase (PE) cycles of the block, without sacrificing the block capacity. As described, one or more dummy wordlines may be used as this representative wordline that characterize a block or block-group.

Figure 1A:
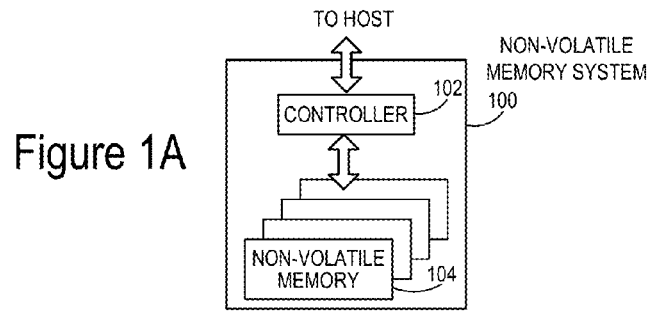
FIG. 1A is a block diagram of an example non-volatile memory system.

FIGS. 1A-2B are exemplary memory systems which may implement the behavior tracking of memory blocks. FIG. 1A is a block diagram illustrating a non-volatile memory system. The non-volatile memory system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The non-volatile memory die 104 may store an operating system for the host.

Examples of host systems include, but are not limited to, personal computers (PCs), such as desktop or laptop and other portable computers, tablets, mobile devices, cellular telephones, smartphones, personal digital assistants (PDAs), gaming devices, digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

Although in the example illustrated in FIG. 1A, non-volatile memory system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
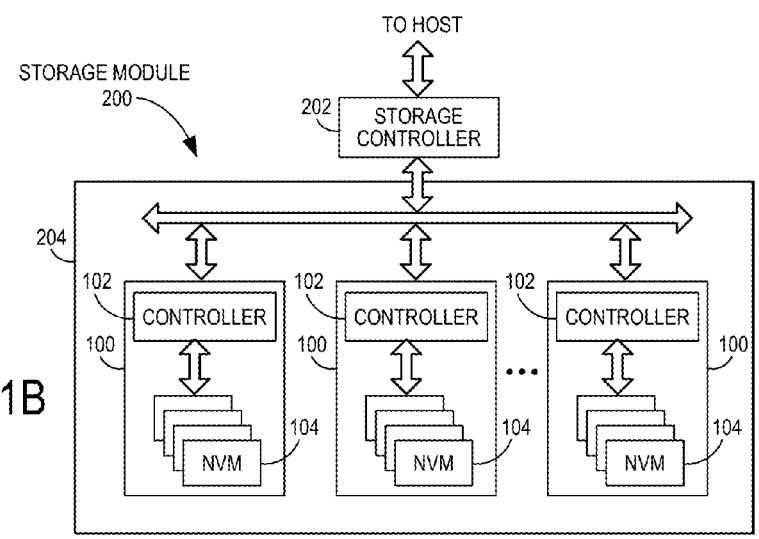
FIG. 1B is a block diagram of a storage module that includes a plurality of non-volatile memory systems.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
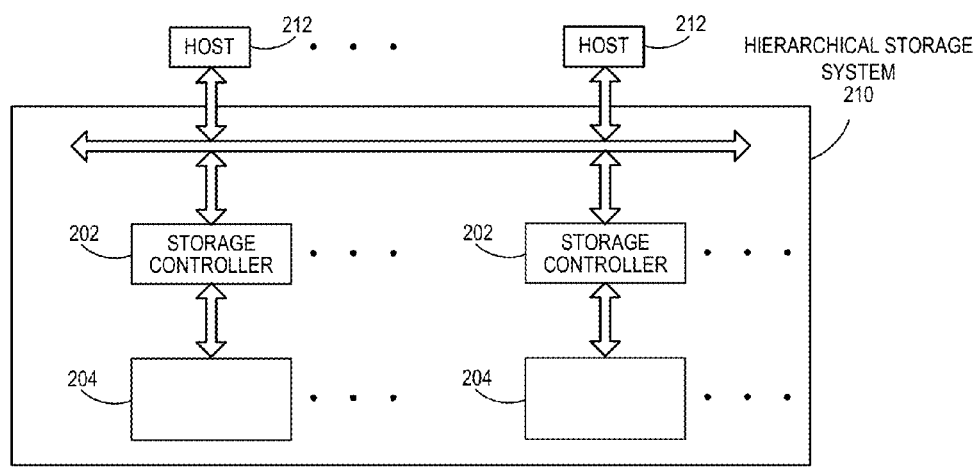
FIG. 1C is a block diagram of a hierarchical storage system.

FIG. 1C is a block diagram illustrating a hierarchical storage system. A hierarchical storage system 210 includes a plurality of storage controllers 202, each of which control a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
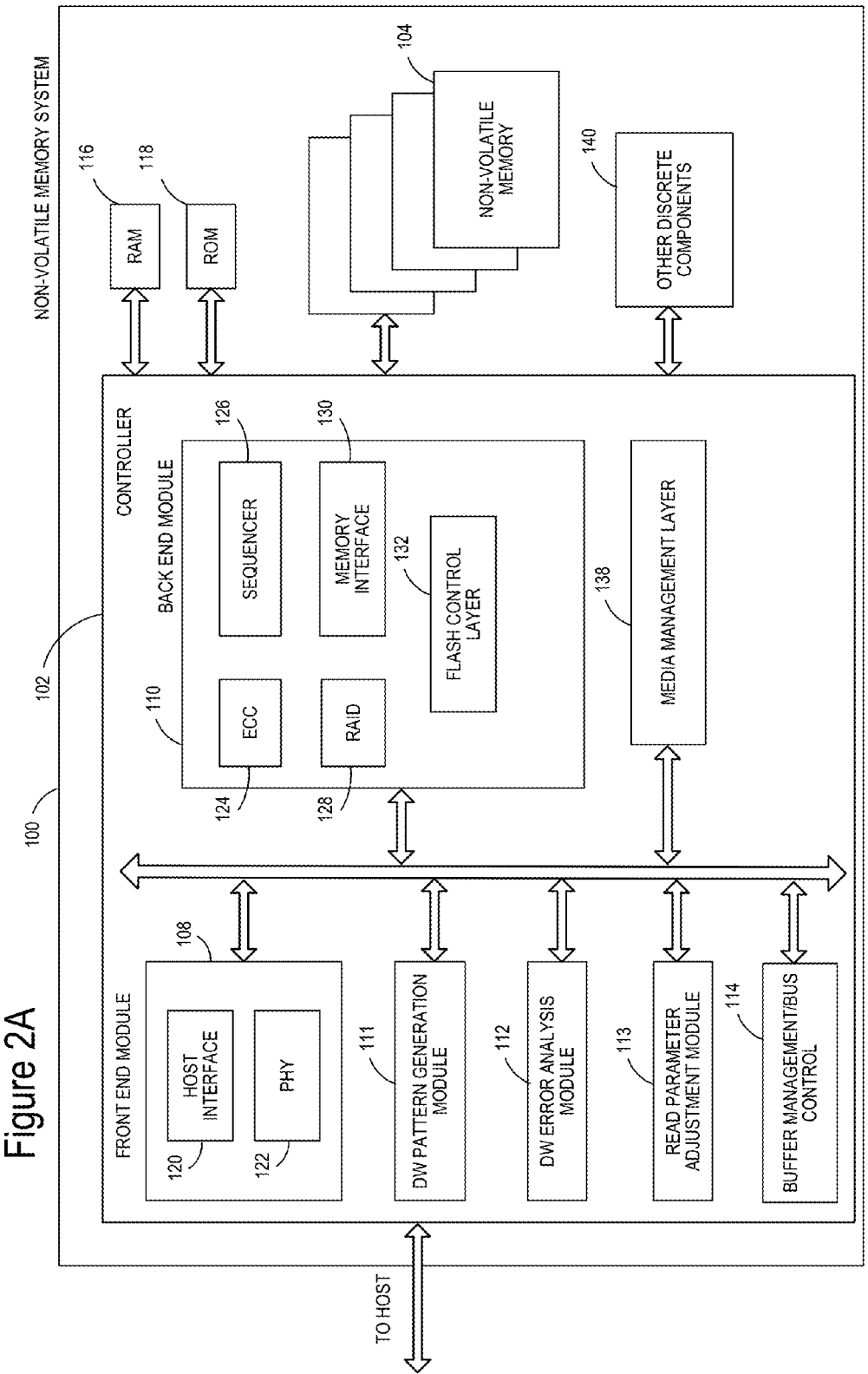
FIG. 2A is a block diagram of exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 104, for example, that comprises instructions executable with a processor to implement one or more of the features of the module. When any one of the modules includes the portion of the memory that comprises instructions executable with the processor, the module may or may not include the processor. In some examples, each module may just be the portion of the memory 104 or other physical memory that comprises instructions executable with the processor to implement the features of the corresponding module.

Figure 3:
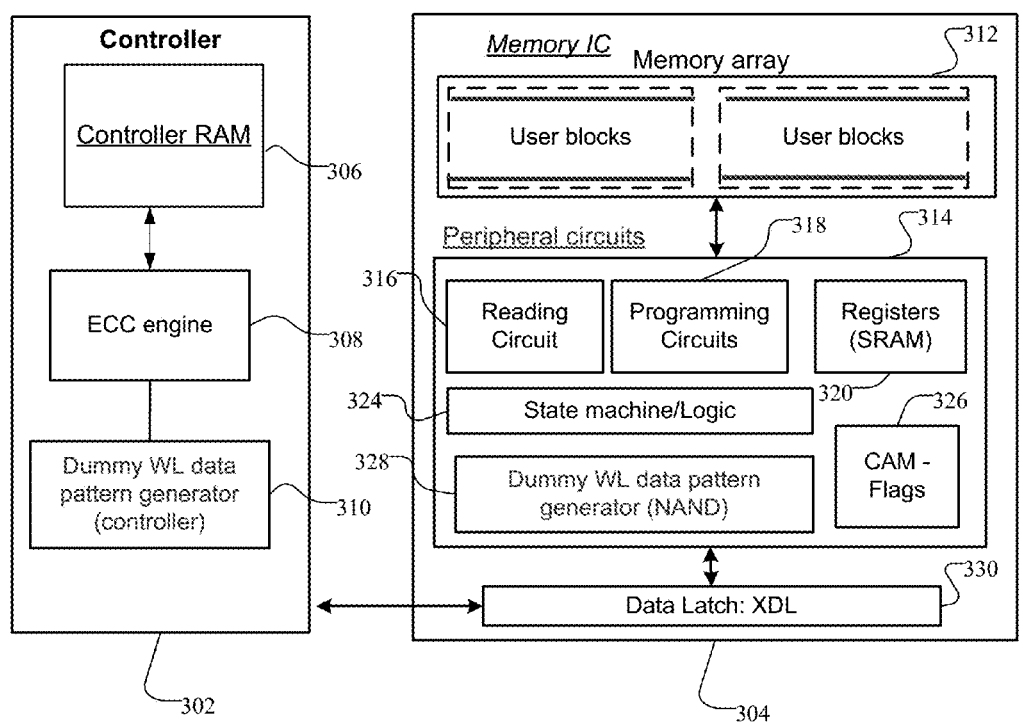
FIG. 3 is a block diagram of an exemplary memory controller and memory array.

Modules of the controller 102 may include a dummy wordline (DW) pattern generation module 111, a DW error analysis module 112, and/or a read parameter adjustment module 113 present on the die of the controller 102. As explained in more detail below in conjunction with FIGS. 3-15, the dummy wordlines of a block may be analyzed for behavior tracking and health determinations for each block. In particular, the DW pattern generation module 111 may put a known data pattern onto one or more dummy wordlines. That data pattern may be tracked or checked periodically for errors by comparing with the known data pattern in the DW error analysis module 112. Based on the behavior (e.g. errors) found in the dummy wordlines, the read parameter adjustment module 113 may optimize certain features of the memory block. FIG. 3 illustrates an alternative embodiment of the memory system and illustrates an alternative data pattern module.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

The FTL or MML 138 may be integrated as part of the flash management that may handle flash errors and interfacing with the host. In particular, MML may be a module in flash management and may be responsible for the internals of NAND management. In particular, the MML 138 may include an algorithm in the memory device firmware which translates writes from the host into writes to the flash memory 104. The MML 138 may be needed because: 1) the flash memory may have limited endurance; 2) the flash memory 104 may only be written in multiples of pages; and/or 3) the flash memory 104 may not be written unless it is erased as a block. The MML 138 understands these potential limitations of the flash memory 104 which may not be visible to the host. Accordingly, the MML 138 attempts to translate the writes from host into writes into the flash memory 104. As described below, erratic bits may be identified and recorded using the MML 138. This recording of erratic bits can be used for evaluating the health of blocks.

Figure 2B:
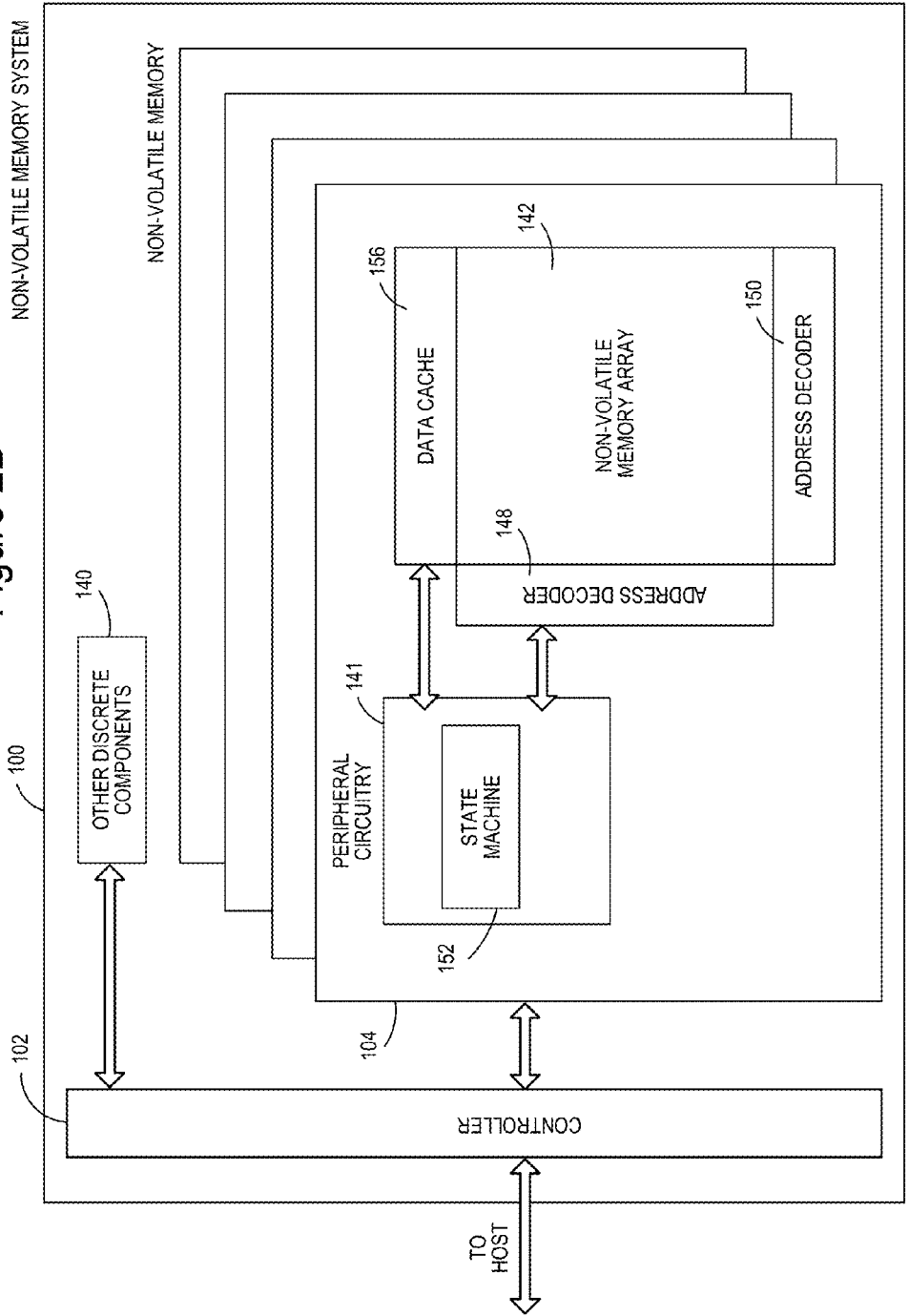
FIG. 2B is a block diagram of exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

FIG. 3 is a block diagram of an exemplary memory controller and memory array. FIG. 3 illustrates an alternative embodiment of the memory system shown in FIGS. 1-2, and illustrates alternative data pattern modules. The memory controller 302 is coupled with the memory integrated circuit (IC) 304. The controller 302 includes random access memory (RAM) 306 and an error correction code (ECC) engine 308. The ECC engine 308 may be part of or coupled with the error analysis module to identify errors in the data pattern on the dummy wordlines. The controller 302 may also include the dummy wordline pattern generator 310, which is similar to the DW pattern generation module 111. Rather than being located on the controller 302, the dummy wordline data pattern generator 328 may alternatively be located on the memory integrated circuit 304. Likewise, the DW error analysis module 112 and/or the read parameter adjustment module 113 may be located with the controller, or may be part of the memory (e.g. the dummy wordline data pattern generator 328 in FIG. 3).

The memory IC 304 may include a memory array of user blocks 312 and peripheral circuits 314. The dummy wordline data pattern generator 328 may be part of the peripheral circuits 314. The peripheral circuits 314 may also include a reading circuit 316 for reading data from the user blocks 312 and programming circuits 318 for programming data to the user blocks 312. Registers 320 may be static RAM and there may be state machine 324 or other logic, along with CAM flags 326 to notify when the dummy wordlines are being used. In particular, the CAM flags 326 may be any notifier for identifying when dummy wordlines are being used (i.e.

programmed with the known data pattern and analyzed). A transfer data latch XDL 330 may communicate with the controller. In an alternative embodiment, the error analysis module (i.e. the comparison of the stored dummy wordline data with the known data pattern) may be part of the data latch XDL 330.

Figure 4:
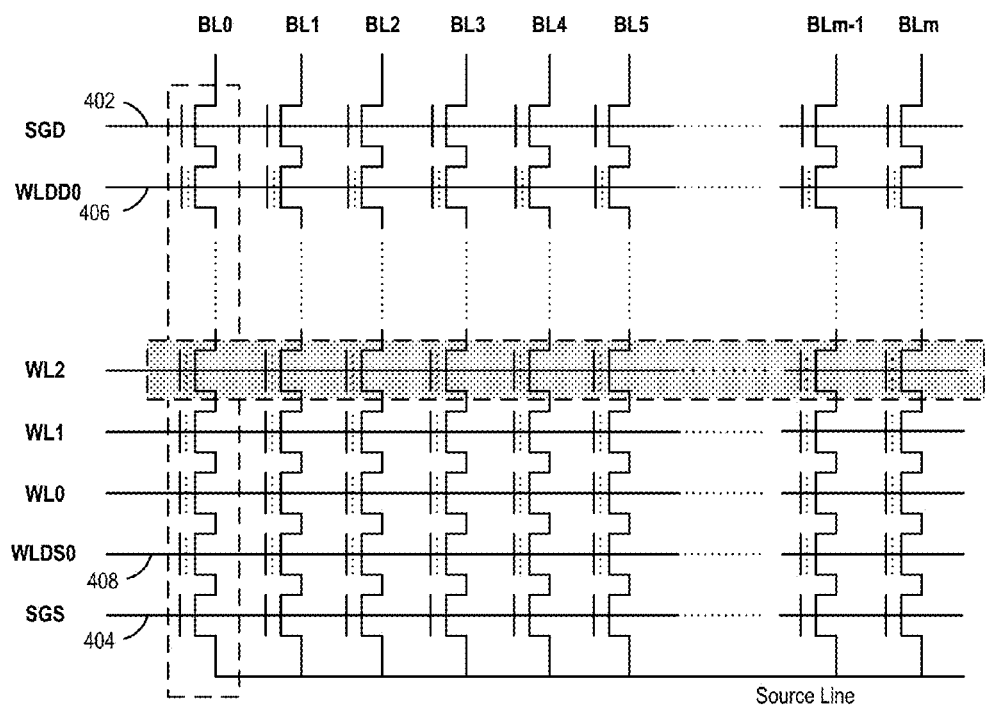
FIG. 4 is an exemplary physical memory organization of a memory block.

FIG. 4 is an exemplary physical memory organization of a memory block. FIG. 4 illustrates a page of memory cells, organized for example in the NAND configuration, being sensed or programmed in parallel. A bank of NAND chains are shown in the exemplary memory. A page may be any group of memory cells enabled to be sensed or programmed in parallel. The page is enabled by the control gates of the cells of the page connected in common to a wordline and each cell accessible by a sensing circuit accessible via a bit line (bit lines BL0-BLm). As an example, when respectively sensing or programming the page of cells, a sensing voltage or a programming voltage is respectively applied to a common word line (e.g. WL2) together with appropriate voltages on the bit lines. A silica gate drain (SGD) 402 is shown opposite from a decoding gate, such as silica gate source (SGS) 404. SGS 404 may also be referred to as the source gate or source, while SGD 402 may be referred to as the drain gate or drain. Directly adjacent to the source/drain gates are dummy wordlines. A dummy drain wordline (WLDD0) 406 is adjacent the drain gate 402. A dummy source wordline (WLDS0) 408 is adjacent to the source gate 404. The dummy wordlines may be adjacent to normal wordlines (e.g. WL0, WL1, WL2 . . . ). The dummy wordlines may act as buffers to separate the source/drain gates from the normal wordlines. The dummy wordlines are not used, but rather provide a buffer or barrier to protect the normal wordlines from potential defects.

Figure 5:
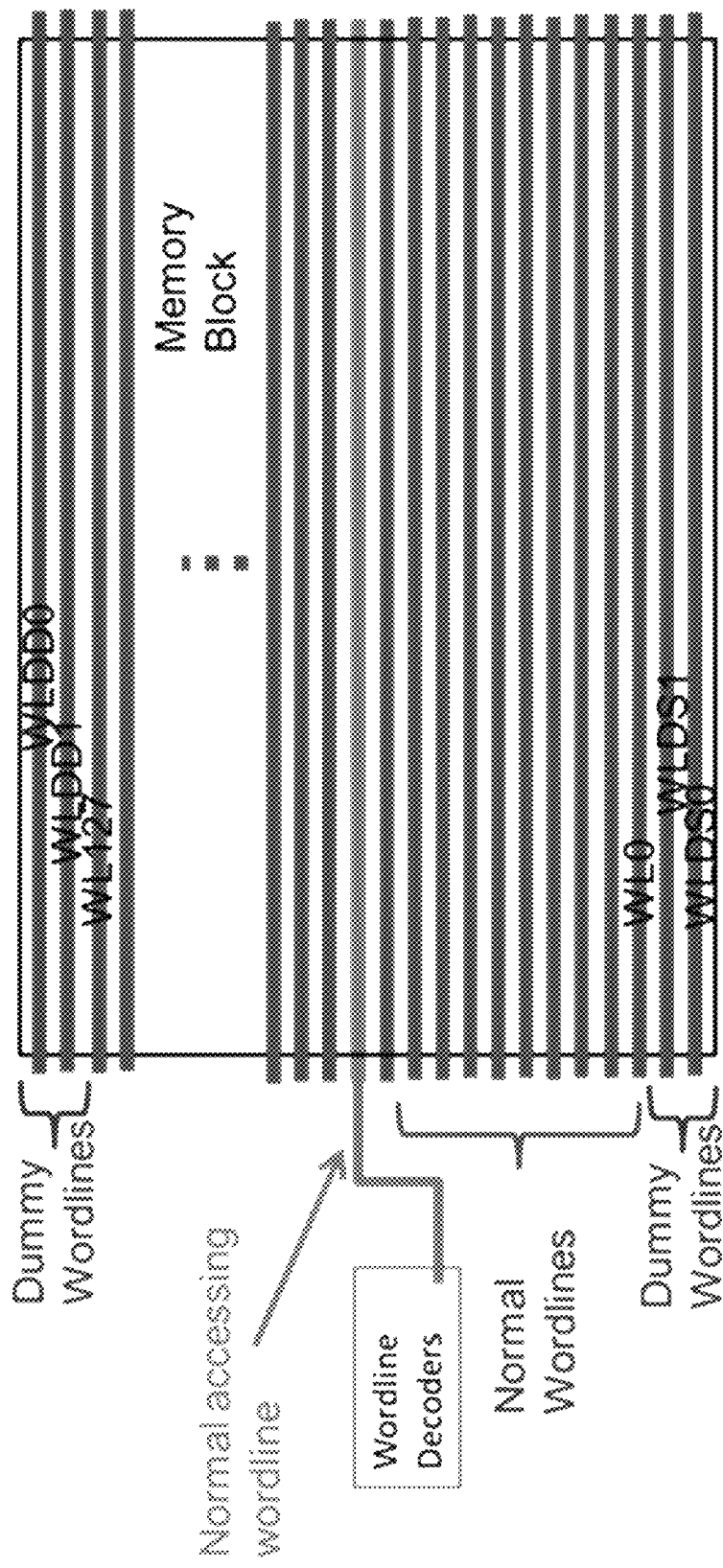
FIG. 5 is a diagram of wordlines of a memory block.

FIG. 5 is a diagram of wordlines of a memory block. FIG. 5 is an alternative embodiment of the wordlines shown in FIG. 4. FIG. 5 illustrates two dummy wordlines on either side of the normal wordlines. WLDD0 and WLDD1 are dummy wordlines on the drain side and WLDS0 and WLDS1 are dummy wordlines on the source side. The normal wordlines (WL0-WL127) are shown between the dummy wordlines. Typically, a dummy wordline may just be a spacer for the normal wordlines, but as described herein, the dummy wordlines may be programmed and analyzed as a reflection of the health/behavior of the normal wordlines of a block.

For the purpose of not affecting the normal erase operation of the NAND memory array, the selection of the dummy wordlines for the tracking may be made such that the dummy wordline can be erased together with the array without affecting other wordlines. In one embodiment, multiple dummy wordlines may be used to represent a block or block-group. In an alternative embodiment, only one of the dummy wordlines (e.g. a source side dummy wordline or a drain side dummy wordline) may be selected to represent a block or block group.

Figure 6:
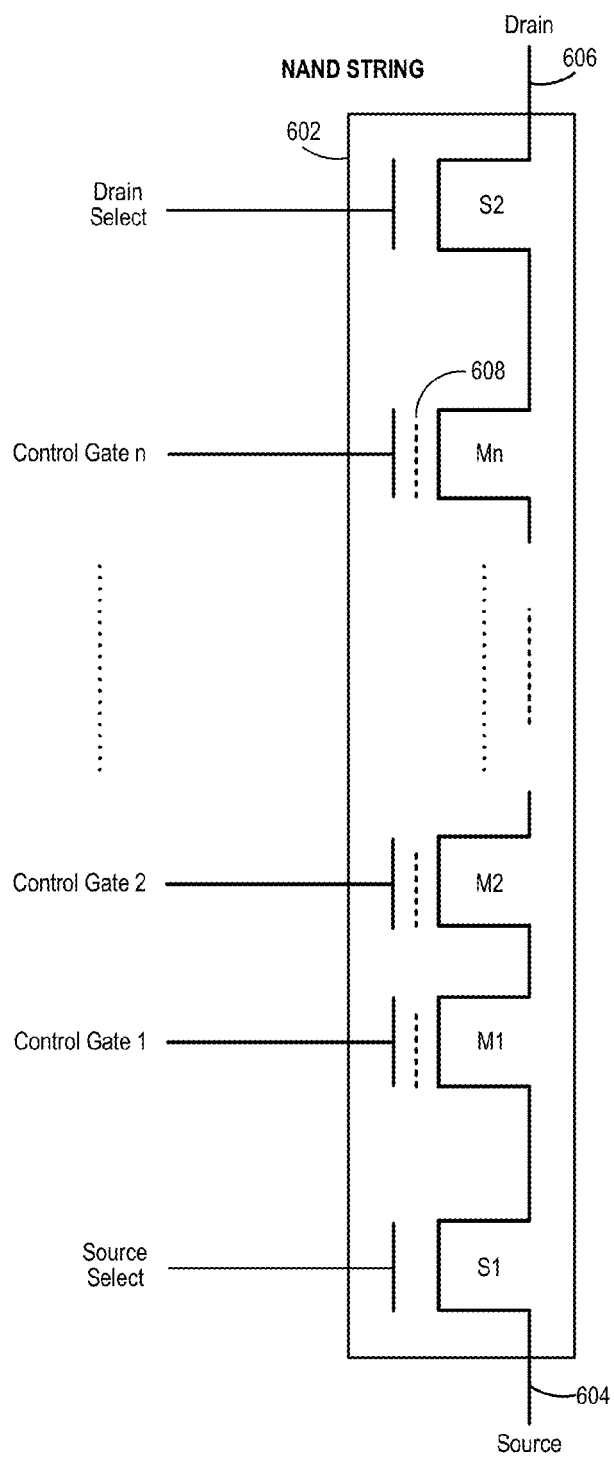
FIG. 6 is a diagram of exemplary wordlines of a NAND string.

FIG. 6 is a diagram of exemplary wordlines of a NAND string. An NAND string 602 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 604 and drain terminal 606 respectively. In a memory array, when the source select transistor S1 is turned on, the source terminal is coupled to a source line. Similarly, when the drain select transistor S2 is turned on, the drain terminal of the NAND string is coupled to a bit line of the memory array. Each memory transistor (M1-Mn) in the chain acts as a memory cell. It has a charge storage element 608 to store a given amount of charge so as to represent an intended memory state. A control gate of each memory transistor allows control over read and write operations. The control gates of corresponding memory transistors of a row of NAND string 602 are all connected to the same word line. A source select gate of each of the select transistor S1 provides control access to the NAND string via its source terminal 604. A drain select gate of the select transistors S2 provides control access to the NAND string via its drain terminal 606.

When an addressed memory transistor (M1-Mn) within an NAND string is read or is verified during programming, its control gate is supplied with an appropriate voltage. At the same time, the rest of the non-addressed memory transistors in the NAND string 602 are fully turned on by application of sufficient voltage on their control gates. In this way, a conductive path is created from the source of the individual memory transistor to the source terminal 604 of the NAND string and likewise for the drain of the individual memory transistor to the drain terminal 606 of the cell.

Figure 7:
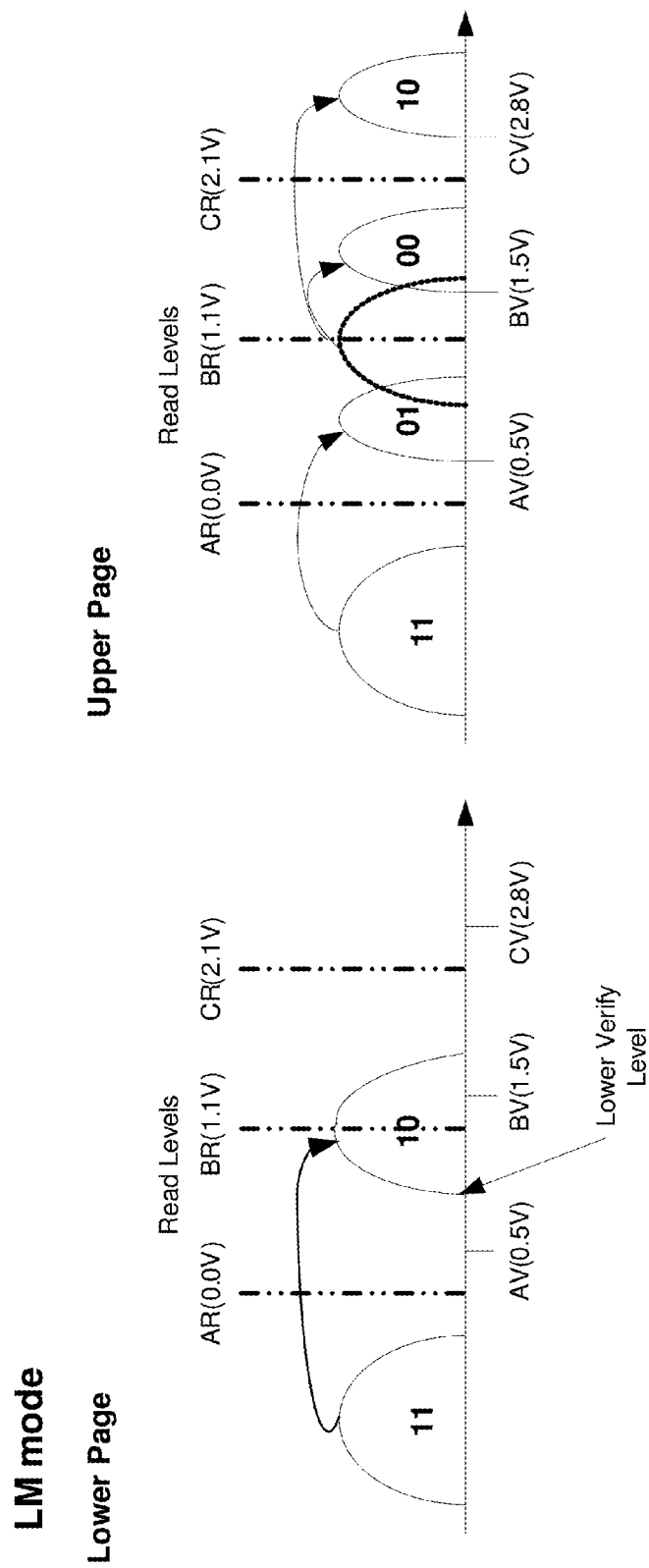
FIG. 7 is a diagram illustrating charge levels in a multi-level cell memory operated to store two bits of data in a memory cell.
Figure 8:
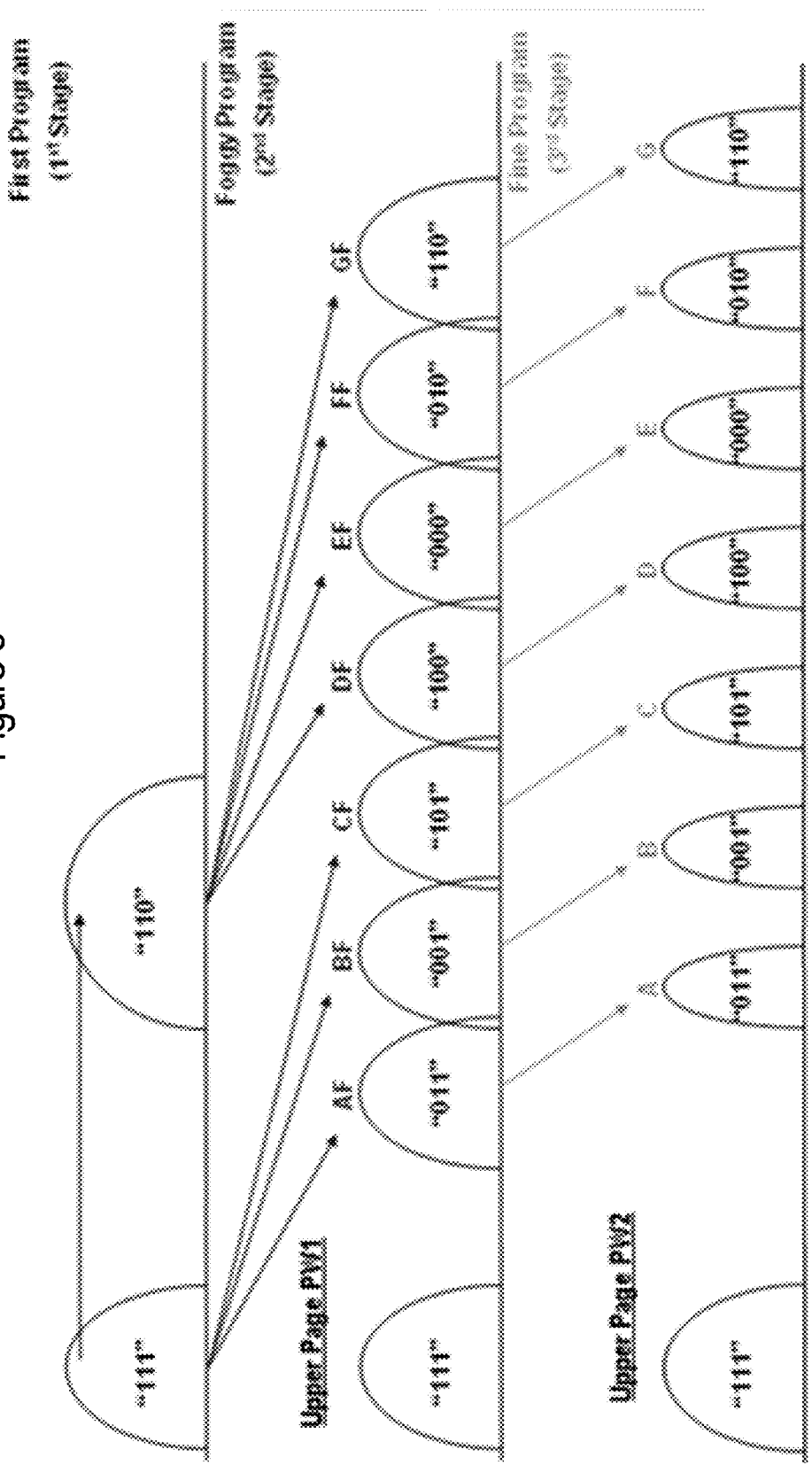
FIG. 8 is a diagram illustrating charge levels in a multi-level cell memory operated to store three bits of data in a memory cell.

The dummy wordlines may be programmed and analyzed as a reflection of the behavior/health of the rest of the memory page or block. The analysis may include a determination of whether the pattern data stored in the dummy wordlines is correct. Incorrect data may result from several causes that result in a change of state. The charge levels of the individual cells are illustrated in FIGS. 7-8. Changes to those charge levels from errors are shown in FIG. 9 and a bias adjustment that can correct for those errors is shown in FIG. 10. In other words, FIG. 10 illustrates the modification of charge levels (i.e. read voltage parameters) which may be performed by the read parameter adjustment module 113. Alternatively, other trim parameters may be adjusted rather than just the voltage/charge level. For example, the programming speed may be optimized based on the analysis of the data stored on the dummy wordlines.

FIG. 7 is a diagram illustrating charge levels in a multi-level cell memory operated to store two bits of data in a memory cell. The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Alternatively, MLC memory may store eight states for retaining three bits of data. FIG. 7 illustrates MLC memory with two bits of data (four states) and FIG. 8 illustrates MLC memory with three bits of data (eight states). The charge storage elements of the memory cells are most commonly conductive floating gates but may alternatively be non-conductive dielectric charge trapping material.

FIG. 7 illustrates one implementation of the four charge levels used to represent two bits of data in a memory cell. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

FIG. 7 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

FIG. 8 is a diagram illustrating charge levels in a multi-level cell memory operated to store three bits of data in a memory cell. FIG. 8 illustrates MLC memory with three bits of data which are stored in a single cell by establishing eight states or voltage level distinctions. This memory may be referred to as X3 memory. FIG. 8 illustrates the stages that may be used for programming three bit memory. In a first stage, the voltage levels are divided out at two levels, and at the second stage (i.e. foggy program), those two levels are divided up into the eight states without setting the distinct levels between states. At the third stage (i.e. fine program), the voltage levels for each of the eight states are separated and distinct. The fine programming establishes the voltage levels for each of the states. As compared with two bit memory, the three bit memory in FIG. 8 requires more exact programming voltages to avoid errors.

Electron movement or loss from the charge values may result in problems (e.g. data retention problems or read disturb errors). Read disturb (RD) errors may be caused when cells in a memory block change over time (e.g. become programmed unintentionally). It may be due to a particular cell being excessively read which may cause the read disturb error for neighboring cells. In particular, a cell that is not being read, but receives elevated voltage stress because a neighboring cell is being read. Charge may collect on floating gates, which may cause a cell to appear to be programmed. Read disturb may move the read voltage to higher values. The read disturb error may result in a data loss. ECC may correct the error and an erase cycle can reset the programming of the cell.

Specifically, read disturb may include an inadvertent transition from the erase state to the next state (sometimes referred to as the A state). For example, in FIG. 7, this would be a transition from 11 to 01, or in FIG. 8, this would be a transition from 111 to 011. This inadvertent transition may be caused by voltage applied to neighboring wordlines/cells that cause the erased state (e.g. 111) to have enough charge to pass the next voltage level and into a different state (e.g. 011). Frequent read operations to the programmed wordlines/cells may result in this inadvertent transition from the erase state.

FIG. 9 is a diagram of state changes in charge levels. The charge states shown in FIG. 9 may be any of the states from FIGS. 7-8. FIG. 9 illustrates a charge loss scenario (upper charge states) and a charge gain scenario (lower charge states). The charge loss scenario is a data retention (DR) problem and the charge gain scenario is a read disturb (RD) problem. For DR, the voltage level/state 902 is shifted left (lower voltage level) as shown by the new state 904. As a result of the shift from the original state 902 to the lowered state 904, there is an overlap region 906 which may result in errors because the two states shown are indistinguishable in the overlap region 906. For RD, the charge level of the original state 908 is increased to a new state 910. As a result of the shift from the original state 908 to the higher state 910, there is an overlap region 912 which may result in errors because the two states shown are indistinguishable in the overlap region 912. Each cell should be one state; however, when the states shown in FIG. 9 are not well-defined, there may be an overlap that prevents identification of a state.

FIG. 10 is a diagram of bias adjustments that can be made in the charge levels of FIG. 9. The adjustment may be to the voltage level (also referred to as the bias level, read bias, read voltage level, read voltage parameter, read parameter, voltage state, etc.) that distinguishes different states, such as any of the states from FIGS. 7-8. In particular, FIG. 10 represents an exemplary optimization or adjustment that can be made to a block (or cells/wordlines of that block) based on an analysis of the data stored in the dummy wordline(s). FIG. 10 illustrates that the voltage level that distinguishes two states may be adjusted based on the charging behavior suggesting either a charge loss or a charge gain. For a charge loss (DR), the charge states are shifted lower as shown FIG. 9, so the voltage level (i.e. read voltage parameter) can be biased lower. FIG. 10 illustrates that the original voltage level 1002 distinguishing the two states is lowered to a lower voltage level 1004 that more accurately reflects the shifted charge states. Likewise, for a charge gain (RD), the charge states are shifted higher as shown FIG. 9, so the voltage level can be biased higher. FIG. 10 illustrates that the original voltage level 1006 distinguishing the two states is raised to a higher voltage level 1008 that more accurately reflects the shifted charge states.

When the error analysis performed on the known data pattern stored in the dummy wordline(s) indicates that the charge states are shifted, and then the read voltage parameter can be adjusted according to that shift. A shifting read voltage parameter is merely one example of an operation that may be optimized based on the error analysis of the data pattern stored in the dummy wordline(s).

Figure 11:
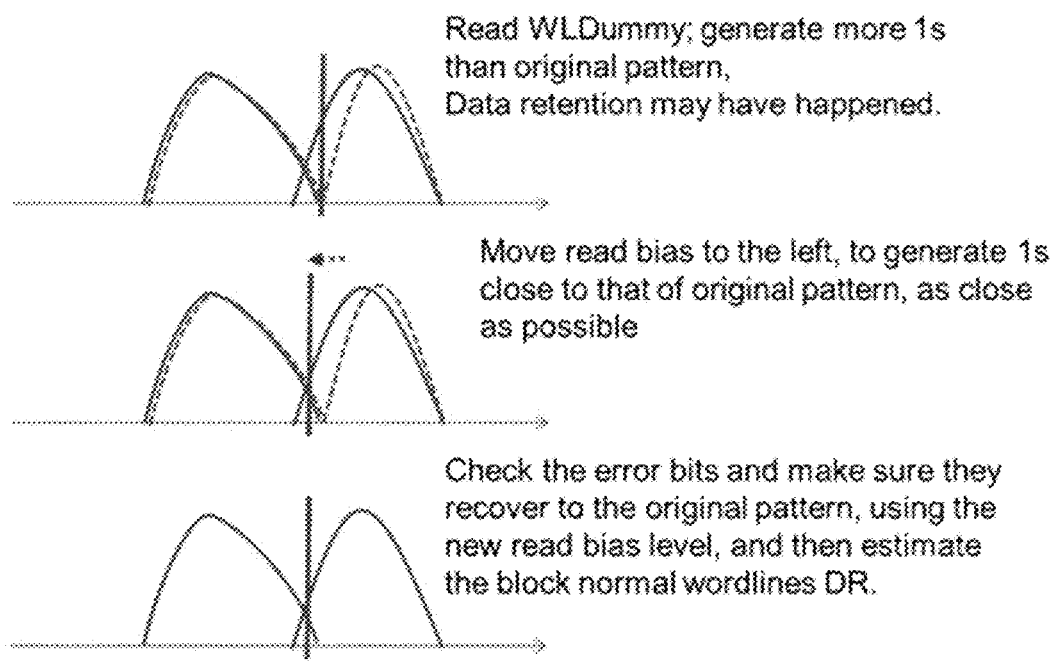
FIG. 11 is a diagram of an alternative embodiment of bias adjustment.

FIG. 11 is a diagram of an alternative embodiment of bias adjustment. In particular, FIG. 11 illustrates the bias adjustment that may be made to the voltage level based on a charge loss. The dummy wordline (WLDummy) may be read and if it generates more ones than the original known data pattern, then data retention may have occurred. In particular, the data pattern to the dummy wordline may be any pattern (e.g. 010101 . . . ) that can be compared against the data that is actually being stored in the dummy wordline. When there are too many ones in the dummy wordline, it is evident of a data retention problem from charge loss. Accordingly, FIG. 11 shows that the voltage level (read bias) is lowered so that the overlap is minimized. After adjustment of the voltage level, then the error bits can be rechecked (e.g. comparison of data in dummy wordline with known data pattern) and the number of error bits should be decreased. Likewise, in the example of read disturb (charge gain) the similar adjustment of the voltage level should reduce the number of excessive zeros caused by charge loss.

Figure 12:
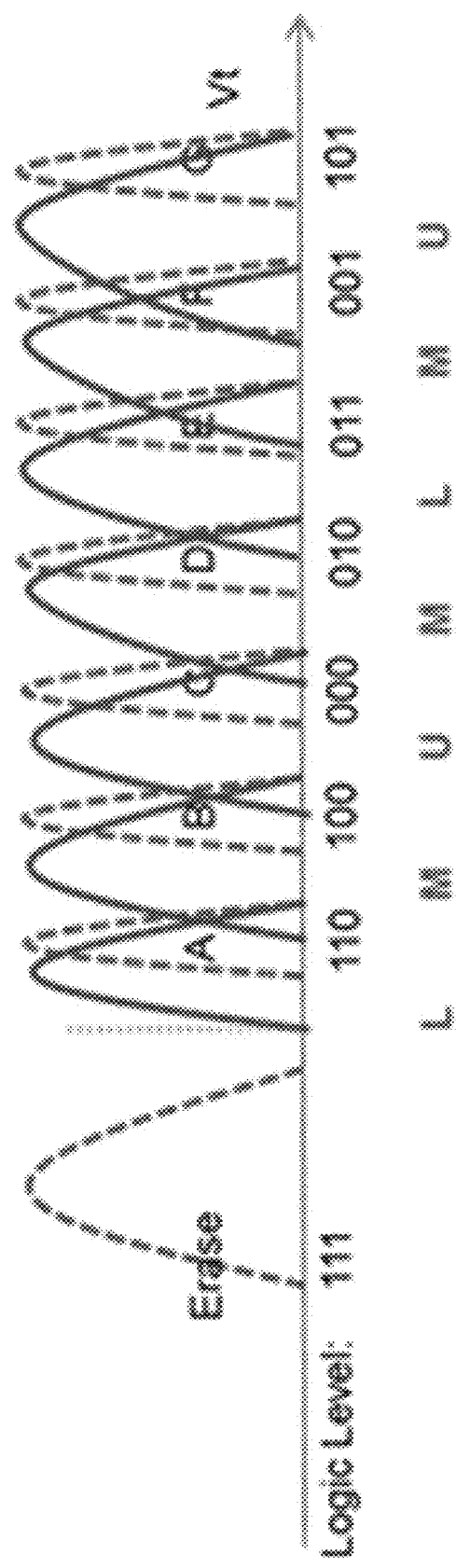
FIG. 12 illustrates an exemplary embodiment of charge loss in the eight states of memory from FIG. 8.

The adjustments made to voltage level between charge states may apply to either 2-bit memory (FIG. 7), 3-bit memory (FIG. 8), or any other memory type. FIG. 12 illustrates an exemplary embodiment of charge loss in the eight states of memory from FIG. 8. As with FIGS. 9-11, the original states (dotted lines) are shifted to the new states (solid lines). In this case, a charge loss causes the states to be lowered. FIG. 12 illustrates overlapping portions between multiple states. An adjustment to the voltage levels between each of the states (as shown in FIG. 11) can reduce the errors. As discussed, this analysis may be performed based on a comparison of the data stored in a dummy wordline with the known data pattern that should be present in the dummy wordline. This analysis may be an accurate representation of the remainder of the block. Accordingly, the analysis of the dummy wordline may apply to all normal wordlines of the block.

The read voltage level may be adjusted different amounts for each of the states. For example, there may be a different read voltage level between each of the states in FIG. 8 or FIG. 12 and the read voltages may be adjusted individually based on the shifting of each state. FIG. 12 illustrates that each state may have a different shift. The calculations described below may be made for each read voltage level between each state.

Figure 13:
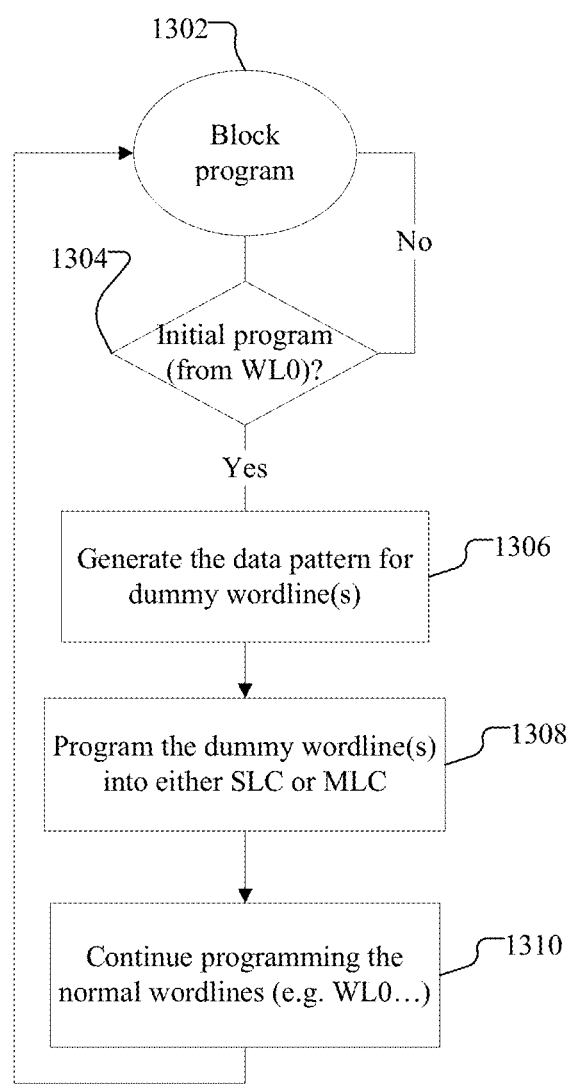
FIG. 13 is a flowchart illustrating exemplary programming of a block.

FIG. 13 is a flowchart illustrating exemplary programming of a block 1302. During an initial programming of a block, the dummy wordline(s) are also programmed. If the block programming 132 is for the initial programming of the block 1304, then a data patter is generated for the dummy wordline(s) 1306. If the block programming 132 is not for the initial programming of the block 1304, then the block program continues 1302 without re-programming the dummy wordline(s). The generated data pattern is programmed into the dummy wordline(s) in either SLC or MLC 1308. After programming the dummy wordline(s) 1308, the normal wordlines are then programmed 1310 (e.g. wordlines 0-127 in FIG. 5).

The dummy wordline data pattern can be any data pattern that is programmed into the dummy wordline as long as it is known and can then be compared. Once the dummy wordline is programmed with this known data pattern, then the dummy wordline can be checked periodically to compare the data that is actually stored at the dummy wordline with the known data pattern that should be the data stored in the dummy wordline. In one example, the known data pattern that is programmed into the dummy wordline(s) may include an equal number of zeroes and ones. For example, an alternating pattern of zero and one may be an exemplary pattern (i.e. 010101010 . . . ). In alternative embodiments, the data pattern may be a known pattern such as 0x1a2b3c4d, or 0x5a5a5a5a, etc. The same data pattern may be used for all dummy wordlines, or dummy wordlines may each have a different known data pattern for comparison. As described, an error analysis (which may include a charge state comparison from FIGS. 7-12) may be used to assess the behavior or health of a block that is represented by the dummy wordline.

Figure 14:
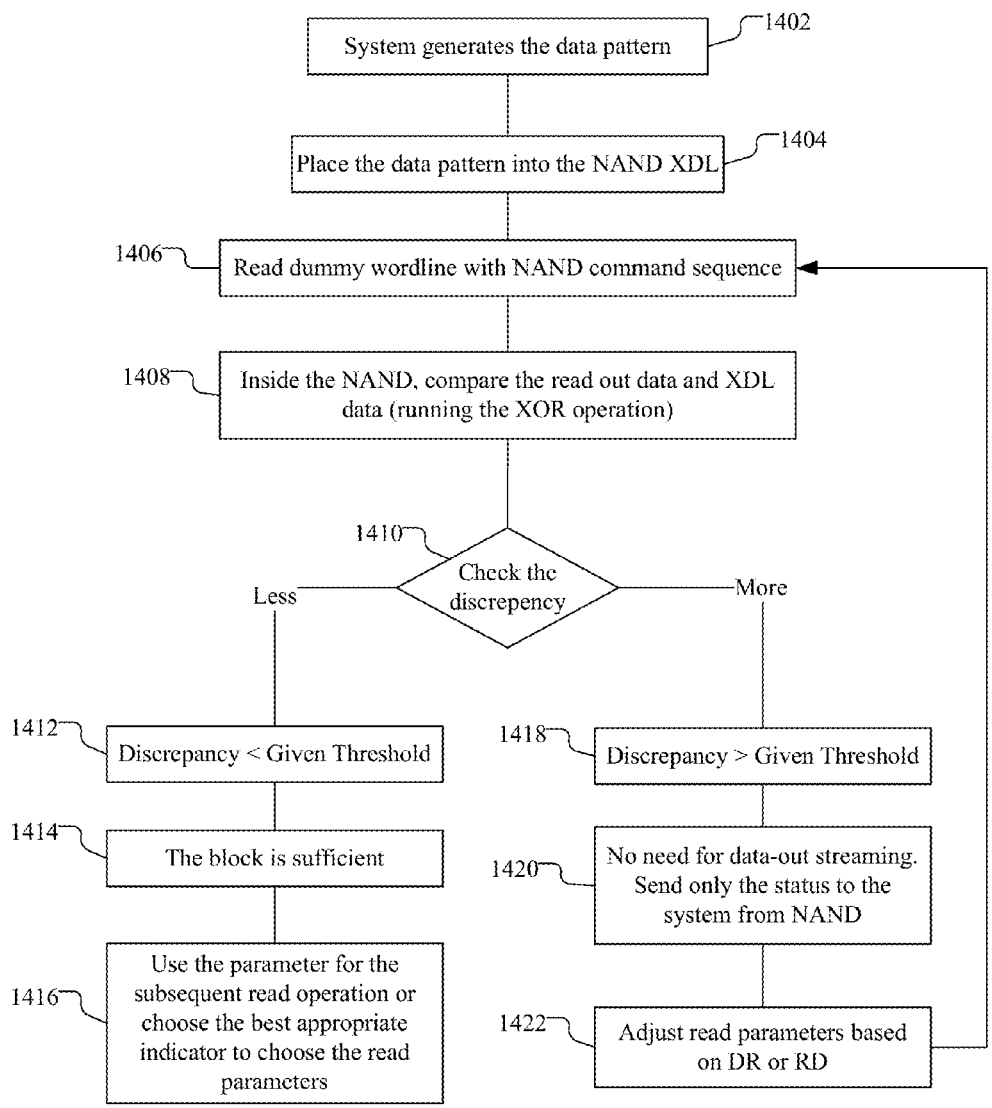
FIG. 14 is a flowchart illustrating an exemplary algorithm for assessing the condition of a block.

FIG. 14 is a flowchart illustrating an exemplary algorithm for assessing the condition of a block. In particular, the algorithm may include comparing the data stored in the dummy wordline(s) against the known data pattern(s) that should be stored in the dummy wordline(s). The system generates the data pattern 1402 as further described with respect to FIG. 13. The data pattern is placed into the NAND transfer data latch 1404 (XDL 304). The dummy wordline is read with NAND command sequence 1406. The comparison is performed between the data that is read out and the known data pattern (XDL data) 1408. An XOR operation may be used to compare the data on the dummy wordline with the known data pattern. Since the data pattern is known, the number of error bits from the dummy wordline can be determined by either using the ECC engine of the controller, the DMC of the controller, or the DMC of the NAND on-chip capability.

Any discrepancies between the stored data (NAND reading) and the known data pattern (XDL data) are identified 1410. The discrepancy may be a count of bits in error. The bits in error may be a count of the zeroes and a count of the ones and a determination if those match the known data pattern. If there are increased number of zeros and a decreased number of ones, then a charge gain has happened and read disturbance is present for the block. If there is an increased number of ones and decreased number of zeros, then a charge loss has happened and there is a data retention problem with the block. The locations of these error bits are known by comparing with the original data pattern using XOR logic. There may be an acceptable level of bits in error for the dummy wordline that is set as a threshold. When the discrepancy is less than that threshold 1412, the block is deemed to be fine 1414 and parameters may not be adjusted 1416 or may be optimized based on the discrepancy.

When the discrepancy is greater than a threshold 1418 (i.e. the number of bits in error is greater than the threshold error bits), then the error analysis module determines changes. Because the error bits have exceeded the threshold, there may be no need for data out streamlining and a status is provided regarding this block 1420. The parameters of the block may be adjusted to reduce the number of error bits 1422. In particular, FIG. 15 illustrates an exemplary adjustment process based on the discrepancy.

Figure 15:
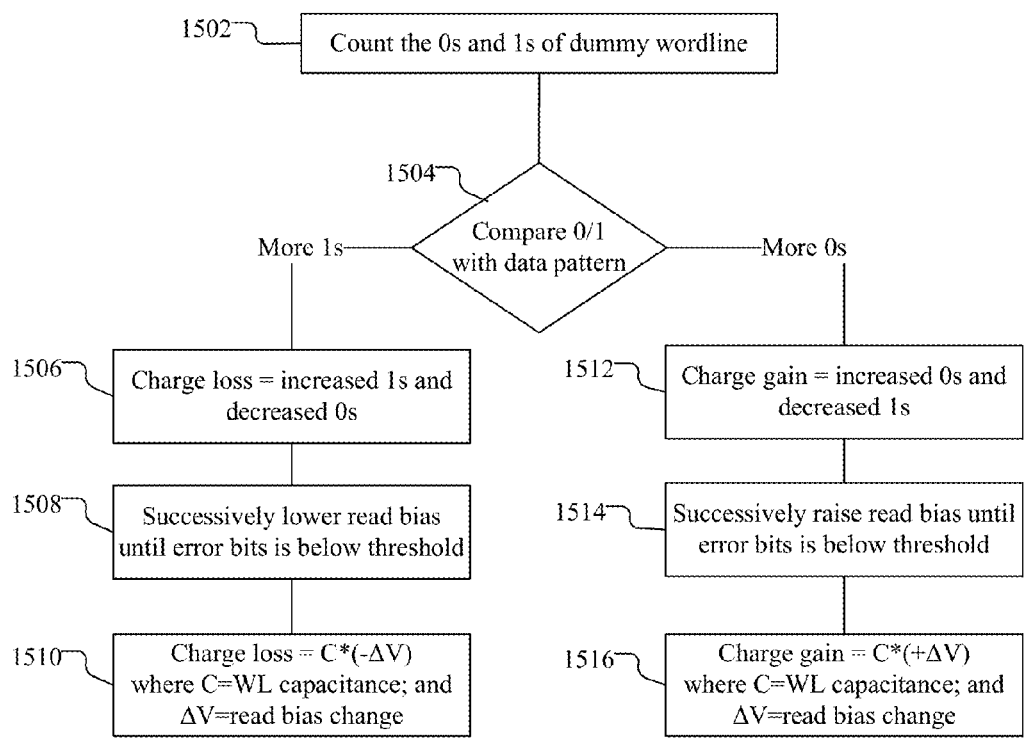
FIG. 15 is a flowchart illustrating an exemplary algorithm for parameter adjustment.

FIG. 15 is a flowchart illustrating an exemplary algorithm for parameter adjustment. The 0s and 1s of the dummy wordline are counted 1502 and compared with the known numbers of 0s and 1s from the data pattern 1504. An increase in 1s is indicative of a charge loss 1506 and an increase in 0s is indicative of a charge gain 1512.

A charge loss 1506 is indicative of a data retention problem. In response to the charge loss 1506, the read bias can be successively lowered to reduce the error bits 1508. The amount of data retention may be reduced by successively lowering down the read bias until the dummy wordline data is as close as possible to the original DMC (0 and 1 bits count) of the dummy wordline. The number of error bits may be monitored to make sure they are reduced to confirm that the read bias is moved in the correct direction. Once an optimum new read bias is reached, then the charge loss can be calculated 1510. The charge loss may be: $Q=C*(-\Delta V)$, where C is the capacitance of the dummy wordline and $-\Delta V$ is the read bias reduction. The amount of data retention of the block (i.e. DR of normal wordlines) may be determined using a ratio between the dummy wordline and the normal wordlines. The wordline width (e.g. the lithographical dimension) of the dummy wordlines may be different from the regular data wordlines. In one example, the dummy wordline can be 5% wider than the regular wordlines. Accordingly, the charge loss from the dummy wordline may be translated to 0.95 Q of the regular wordline charge loss. The bias change is therefore 0.95 $\Delta V$ and the ratio is 0.95. Based on the amount of DR, there may be further action to be taken for the block. For example, the data on the block may be relocated, or simply changing the read bias may be sufficient.

A charge gain 1512 is indicative of a read disturb problem. In response to the charge gain 1512, the read bias can be successively lowered to reduce the error bits 1514. The amount of read disturb may be reduced by successively increasing the read bias until the dummy wordline data is as close as possible to the original DMC (0 and 1 bits count) of the dummy wordline. The number of error bits may be monitored to make sure they are reduced to confirm that the read bias is moved in the correct direction. Once an optimum new read bias is reached, then the charge gain can be calculated 1516. The charge gain may be: $Q=C*(+\Delta V)$, where C is the capacitance of the dummy wordline and $+\Delta V$ is the read bias increase. The amount of read disturb of the block (i.e. RD of normal wordlines) may be determined using a ratio between the dummy wordline and the normal wordlines. As discussed above, the ratio of the width of the dummy wordline to a regular wordline may correspond to the ratio of charge loss between those wordlines. Based on the amount of RD, there may be further action to be taken for the block. For example, the data on the block may be relocated, or simply changing the read bias may be sufficient.

The determination of an amount of change to the read voltage level (i.e. bias voltage) may be proportional to an amount of charge that is changed. In other words, the amount of change to the read voltage level corresponds to the amount of change of charge. In one embodiment, the equation for the change in read voltage level is the amount of charge (lost or gained) divided by the capacitance of the dummy wordline. The direction of the change of the read voltage level depends on whether the amount of change of charge is positive (gained charge) or negative (lost charge).

In other embodiments, the error analysis of the dummy wordline described herein may be used to adjust parameters other than the read voltage level. Exemplary parameters may include using stronger or full power ECC decoding scheme for the more error prone memory locations. In addition, that analysis may be used to identify error states (read disturb or data retention) or identify if a block has too high program/erase PE cycling. A block can be identified as a candidate for data detection (or retention), for PE cycle, for primary cycle PC, or for disturbance. The data on the block may need to be refreshed or relocated based on the analysis.

Although the dummy wordline is described as being representative of a block, a block is merely one example of a grouping of memory that is characterized by the dummy wordline. In other embodiments, the grouping of memory that is characterized by the dummy wordline may be larger or smaller than the block size. For example, a meta-block or other block-group may be represented by a particular dummy wordline. As described above, a block is referred to as the unit of memory for each dummy wordline for simplicity and ease of reference. Likewise, a block may be multi-dimensional so that one or more dummy wordlines represent the multi-dimensional group of memory. In particular, the algorithm for analyzing dummy wordline data as representative of overall block behavior or health may apply to three dimensional (3D) memory as well as two dimensional (2D) memory. In 3D memory, the dummy wordline(s) may hold more data, which may be a more accurate reflection of the behavior/health of the block.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory. In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

We claim:
1. A method for determining a health of a block of memory comprising:

programming, by a command issued by a memory controller, a dummy wordline with a known data pattern, wherein the dummy wordline acts as a buffer for normal wordlines;

reading from the dummy wordline;

comparing the read out with the known data pattern;

determining whether any errors between read out and the known data pattern exceed a threshold; and adjusting read parameters based on the errors.

2. The method of claim 1 wherein the read parameters comprise read voltage level.

3. The method of claim 2 wherein the adjusting the read parameters further comprises:

calculating, based on the errors, a charge loss or a charge gain;

decreasing, for a charge loss, the read voltage level; and increasing, for a charge gain, the read voltage level.

4. The method of claim 3 wherein the charge gain represents a read disturb error or program disturb from charge leakage into a memory cell.

5. The method of claim 3 wherein the charge loss represents a data retention error.

6. The method of claim 3 wherein the calculating comprises using a known number of 0 bits and known number of 1 bits from the known data pattern and measuring a change to the number of 0 bits and a change to the number of 1 bits.

7. The method of claim 6 wherein the calculating comprises counting the 0 bits and 1 bits such that an increase in 0 bits is the charge gain and an increase in 1 bits is the charge loss.

8. The method of claim 7 wherein an amount of adjustment to the read voltage level is determined based on the change in the calculation.

9. The method of claim 8 wherein the amount of adjustment corresponds to a voltage amount that is determined by an approximation of stored electrons for the change in the 0 bit values.

10. The method of claim 1 wherein the dummy wordline is not accessible by a host for data storage.

11. The method of claim 1 wherein the method is performed with flash memory and the flash memory comprises a three-dimensional (3D) memory configuration, and wherein a controller is associated with operation of and storing to the flash memory.

12. A storage device comprising:

a non-volatile memory with blocks of memory, wherein each of the blocks includes one or dummy wordlines;

a pattern generation module that generates and stores a known data pattern on the one or more dummy wordlines;

an error analysis module that compares data stored on the one or more dummy wordlines with the known data pattern; and a read parameter adjustment module that modifies a bias voltage based on the comparison.

13. The storage device of claim 12 wherein the known data pattern comprises a known number of 0 bits and a known number of 1 bits.

14. The storage device of claim 13 wherein the error analysis module comparison comprises a determination of whether there is an increase in 0 bits or an increase in 1 bits, wherein the increase in 0 bits is a charge gain and read disturb error, further wherein the increase in 1 bits is a charge loss and a data retention error.

15. The storage device of claim 14 wherein the read parameter adjustment module increases the bias voltage for the charge gain and decreases the bias voltage for the charge loss.

16. The storage device of claim 15 wherein an amount of change of the bias voltage is calculated based on a voltage amount that is determined by an approximation of stored electrons for the change in the 0 bit values and based on a capacitance value of the one or more dummy wordlines.

17. The storage device of claim 12 wherein the dummy wordline is a barrier to protect normal wordlines and is not accessible by a host for data storage.

18. A method for identifying errors in a block comprising:

storing a known data pattern on a dummy wordline of the block;

comparing the stored data on the dummy wordline with the known data pattern to identify any differences in 0 bits or 1 bits with the stored data;

identifying a read disturb error condition when a charge gain has occurred because of an increase in 0 bits and a decrease in 1 bits; and identifying a data retention error condition when a charge loss has occurred because of an increase in 1 bits and a decrease in 0 bits.

19. The method of claim 18 further comprising:

updating a read bias based on the identification of the read disturb error or the data retention error.

20. The method of claim 19 wherein an amount of shift of the read bias corresponds to a change in charge divided by a capacitance of the dummy wordline, wherein the change in charge comprises a difference in an amount of electrons resulting from errors.

21. The method of claim 19 wherein the read bias comprises a bias for reading regular wordlines and the updating comprises adjusting the bias for reading the regular wordlines.

22. The method of claim 18 wherein the dummy wordline is a spacer outside of normal wordlines that is not accessible by a host for data storage.

23. The method of claim 18 further comprising:

selecting ECC power for data from the regular wordlines, wherein the selecting is based on the dummy wordline error.

24. A method for using a dummy wordline in a memory block, the method comprising:

utilizing a known data pattern on the dummy wordline, wherein the dummy wordline is not accessible by a host for data storage;

comparing data on the dummy wordline with the known data pattern; and identifying errors based on the comparison, wherein the errors determine a health of the block.

* * * * *